(12) United States Patent
Rautmann

(10) Patent No.: US 6,759,890 B2  
(45) Date of Patent: Jul. 6, 2004

(54) INTEGRATED SEMICONDUCTOR MODULE WITH A BRIDGEABLE INPUT LOW-PASS FILTER

(75) Inventor: Dirk Rautmann, Schwindegg (DE)

(73) Assignee: Infineon Technologies AG, Munich (DE)

( * ) Notice: Subject to any disclaimer, the term of this patent is extended or adjusted under 35 U.S.C. 154(b) by 131 days.

(21) Appl. No.: 09/977,788

(22) Filed: Oct. 15, 2001

(65) Prior Publication Data

US 2002/0053913 A1 May 9, 2002

(30) Foreign Application Priority Data

Oct. 14, 2000 (DE) .......................................... 100 51 100

(51) Int. Cl.[7] .............................................. H03K 17/62
(52) U.S. Cl. .......................................... 327/407; 327/99
(58) Field of Search .......................... 327/99, 407–411

(56) References Cited

U.S. PATENT DOCUMENTS 5,963,069 A * 10/1999 Jefferson et al. ............ 327/158
6,559,715 B1 * 5/2003 Frake et al. ................. 327/558

OTHER PUBLICATIONS

"IEEE Standard Test Access Port and Boundary–Scan Architecture", The Institute of Electrical and Electronics Engineers, Inc., New York, NY, 1990.

"PCF8577C Data Sheet LCD direct/duplex driver with I²C–bus interface", Philips Semiconductors, Jul. 30, 1998.

* cited by examiner

*Primary Examiner*—Kenneth B. Wells
(74) *Attorney, Agent, or Firm*—Laurence A. Greenl; Werner H. Stemer; Ralph E. Locher

(57) ABSTRACT

An integrated semiconductor module having at least one terminal for connection to a data bus and having at least one low-pass filter that is connected downstream of the terminal in order to limit the data rate during normal operation. A circuit arrangement is provided for bridging the low-pass filter in order to be able to test the module at a higher data rate.

4 Claims, 1 Drawing Sheet

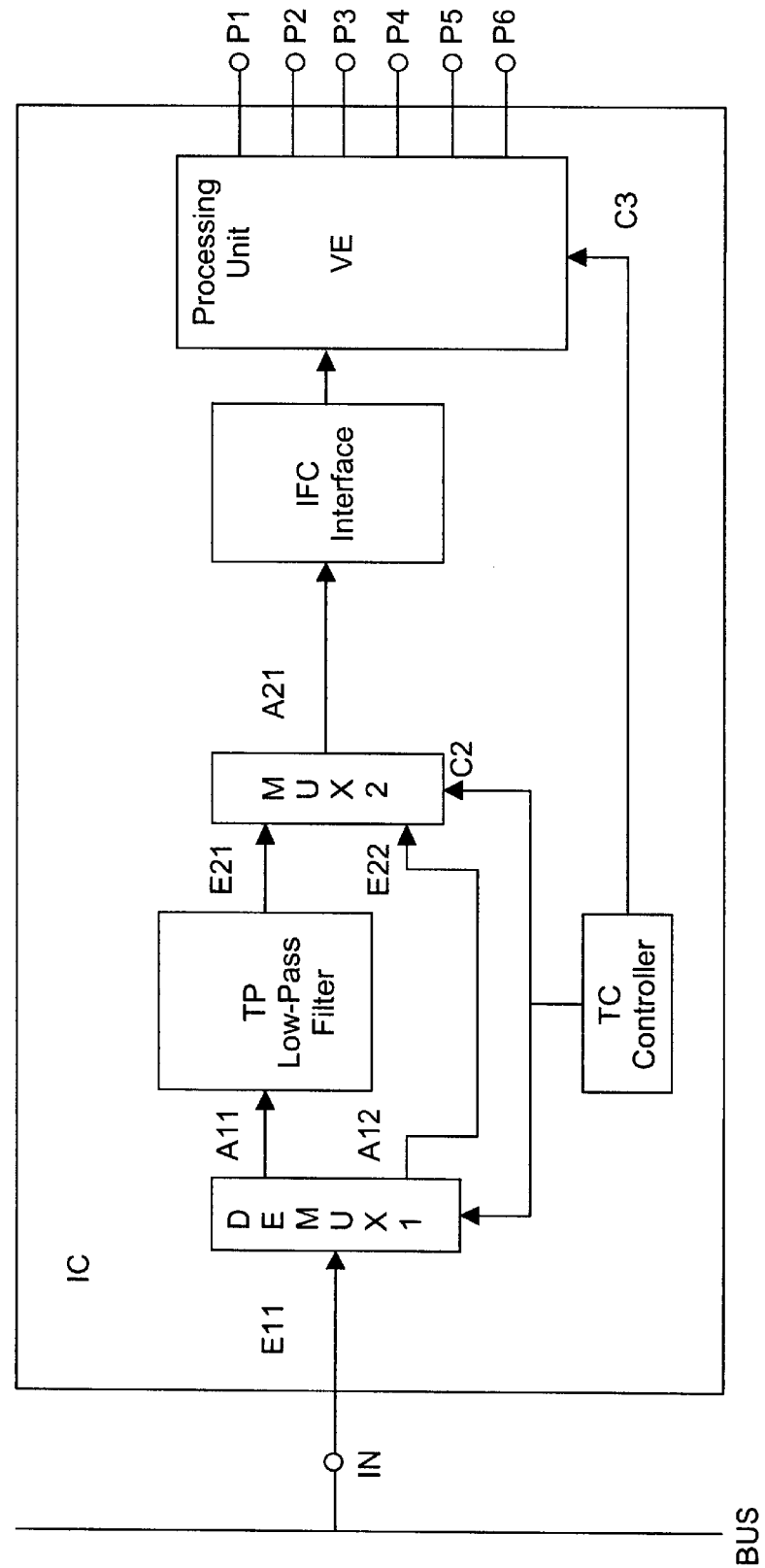

INTEGRATED SEMICONDUCTOR MODULE WITH A BRIDGEABLE INPUT LOW-PASS FILTER

BACKGROUND OF THE INVENTION

Field of the Invention

The present invention relates to an integrated semiconductor module having at least one terminal for connection to an external data bus, and a low-pass filter connected downstream of the terminal.

In order to enable communication between a plurality of integrated semiconductor modules (IC) or in order to drive an integrated semiconductor module, it is known to connect the plurality of the semiconductor modules or the plurality of the semiconductor modules and a drive unit to a common data bus via which the data traffic is effected. In so-called consumer ICs, which are used in objects of everyday life, such as domestic appliances or devices appertaining to entertainment electronics, the so-called Inter IC (IIC bus) has gained acceptance in recent years for data exchange between integrated semiconductor modules. The IIC bus enables standardized data traffic between the individual modules. Each of the modules is provided with a suitable interface circuit that supports the IIC protocol and handles the data traffic via the bus.

An important step in the fabrication of integrated semiconductor modules is that of testing the fabricated module IC to insure freedom from defects. In this case, as many settings as possible or all of the settings which are possible in the integrated circuit are performed and checked. The IC test should take as little time as possible. In order to be able to carry out tests on an IC, additional circuit measures are required in the IC. The outlay for these circuit measures should additionally be kept as low as possible, in other words the additional circuit measures, which are usually required only once during the life of the IC, should take up as little of the available chip area as possible.

Moreover, in the testing it is desirable to use only the IC terminal pins that are required anyway, and not to provide any additional terminal pins for test purposes.

The use of the IIC bus for performing settings on the IC during the test has been unfavorable heretofore because the bandwidth for the data exchange via the IIC bus is limited to 100 kHz or 400 kHz by means of a low-pass filter. This is used, during the later operation of the IC, to filter out high-frequency interference signals on the data bus which may occur for example when the IC is used in television sets.

SUMMARY OF THE INVENTION

It is accordingly an object of the invention to provide an integrated semiconductor module which overcomes the above-mentioned disadvantageous of the prior art apparatus of this general type. In particular, it is an object of the invention to provide such an integrated circuit module, which enables fast testing and requires little additional circuitry.

With the foregoing and other objects in view there is provided, in accordance with the invention, an integrated semiconductor module that is constructed for connection to a data bus. The integrated semiconductor module includes at least one terminal for connection to the data bus; a low-pass filter connected downstream of the terminal; and a circuit configuration for bridging the low-pass filter for test purposes.

In accordance with an added feature of the invention, the integrated semiconductor module is preferably constructed to operate when the data bus is an IIC bus. With the low-pass filter bridged, data can be fed to the semiconductor module for test purposes at a significantly higher clock rate than during normal operation of the IC. The bridging of the low-pass filter, which is otherwise present for reducing the susceptibility to interference, is completely harmless during the test since the test—unlike the later operation of the IC—can take place in a shielded environment. By virtue of the bridging of the low-pass filter, the settings and initializations required for test purposes can be performed within a short period of time on account of the high data rate that can be achieved, or required test patterns can be fed to the module at a high clock rate. The module can thus be tested in a short time.

Since the terminal pin that is present anyway for the data bus is used as the terminal for feeding in the test patterns at high clock rates, the circuitry outlay in the IC that is required for test purposes is low.

In accordance with an additional feature of the invention, the circuit arrangement for bridging the low-pass filter preferably has a demultiplexer and a multiplexer. The demultiplexer is connected upstream of the low-pass filter and the multiplexer is connected downstream of the low-pass filter. In this case, an input of the demultiplexer is preferably connected to the data bus and a first output of the demultiplexer is connected to an input of the low-pass filter. Furthermore, an output of the low-pass filter is connected to a first input of the multiplexer. A second input of the multiplexer, for bridging the low-pass filter, is connected to a second output of the demultiplexer.

In accordance with another feature of the invention, the semiconductor module has a controller circuit which supports testing of the module. The controller circuit assigns functions to the terminal pins of the IC during the test which serve exclusively for test purposes and differ from the functions during normal operation. Thus, by way of example, the values of internal registers or internal clock signals can be output via the terminal pins during the test in order to check whether the respective registers or clock generators function correctly. Such a controller circuit for testing the module is, for example, a TAP controller (TAP=Test Access Port) standardized according to IEEE 1149.1.

accordance a concomitant feature of the invention, the multiplexer and demultiplexer can be driven by the controller circuit in order to bridge the low-pass filter for test purposes.

Other features which are considered as characteristic for the invention are set forth in the appended claims.

Although the invention is illustrated and described herein as embodied in an integrated semiconductor module with bridgeable input low-pass filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE shows a block diagram of an integrated semiconductor module.

DESCRIPTION OF THE PREFERRED EMBODIMENTS

Referring now to the sole drawing FIGURE in detail, there is shown an integrated semiconductor module IC that has an input IN which is connected to a data bus BUS, preferably an IIC bus. Terminals (terminal pins) P1, P2, P3, P4, P5, P6 serve for connection to external components, which may be further integrated circuits. Output quantities, for example for driving the external components, or input quantities which are processed in the integrated semiconductor module IC are available at said terminal pins P1, P2, P3, P4, P5, P6. A processing unit VE, having a multiplicity of circuit components, is present for processing the input and output quantities.

The integrated semiconductor module IC furthermore has an interface circuit IFC, which is connected to the processing unit VE and controls the data exchange between the processing unit VE and the bus. In this case, data from the bus are fed to the processing unit VE via the interface circuit IFC, and data from the processing unit VE are output to the bus via the interface circuit IFC. When an IIC bus is used, the interface circuit IFC is a conventional so-called IIC interface.

Connected between the bus and the interface circuit IFC is a low-pass filter TP, which limits the data rate between the bus and the interface unit IFC, or the processing unit VE. When an IIC bus is used, the maximum data rate is 100 kHz or 400 kHz. This restriction of the data rate prevents high-frequency interference signals which are coupled into the data bus from passing into the processing unit VE and leading to malfunctions there.

According to the invention, the integrated semiconductor module IC has a circuit arrangement for bypassing or bridging the low-pass filter TP for test purposes. In the exemplary embodiment shown in the figure, this circuit arrangement has a demultiplexer DEMUX1 connected between the input IN and the low-pass filter TP. To that end, an input E11 of the demultiplexer DEMUX1 is connected to the input IN and a first output A11 of the demultiplexer DEMUX1 is connected to the low-pass filter. The circuit arrangement for short-circuiting furthermore has a multiplexer MUX2 connected between the low-pass filter TP and the interface circuit IFC. An input of the multiplexer MUX2 is connected to an output of the low-pass filter TP and an output A21 of the multiplexer is connected to the interface circuit IFC. In order to enable bridging of the low-pass filter TP, a second output A12 of the demultiplexer DEMUX1 is connected to a second input E22 of the multiplexer MUX2.

The demultiplexer DEMUX1 and the multiplexer MUX2 are driven by a controller circuit TC which is present for testing the module IC. The controller circuit TC is connected to control inputs C1, C2 of the demultiplexer DEMUX1 and multiplexer MUX 2, respectively. During normal operation of the semiconductor module IC, in the demultiplexer DEMUX1, the input E11 is connected to the first output A11 in order to feed the data from the bus to the low-pass filter TP, and the first input E21 of the multiplexer MUX2 is connected to the output A21 thereof in order to feed the output data from the low-pass filter TP to the interface circuit IFC and thus to the processing unit.

For testing the semiconductor module IC, the demultiplexer DEMUX1 and the multiplexer MUX2 are driven by the controller circuit TC in such a way that the data pass unfiltered from the bus to the interface circuit IFC and the processing unit VE via the second output A12 of the demultiplexer DEMUX1 and the second input E22 of the multiplexer MUX2.

In order to test the module IC, it is necessary to perform all or at least as many as possible of the settings or initializations that are possible on the module IC. By bridging the low-pass filter TP, it is possible for the corresponding control commands to be fed to the IC during testing at a significantly higher clock frequency than during normal operation. The test of the module IC can thus be carried out in a short time using the terminal pin IN that is present anyway for the data bus.

The controller circuit TC for driving the demultiplexer DEMUX1 and the multiplexer MUX2 is preferably a so-called TAP controller (TAP=Test Access Port) in accordance with IEEE 1149.1, which is present for testing the integrated semiconductor module IC. The TAP controller supports the sequence of the test of the integrated module IC. The TAP controller is connected not only to the demultiplexer DEMUX1 and the multiplexer MUX2, but also to the processing unit VE, and assigns different functions to the terminal pins P1, P2, P3, P4, P5, P6 during the test than during normal operation. Thus, by way of example, during testing, the values of internal registers or the signals of internal clock generators can be passed to the outside via the terminal pins P1 . . . P6 in order to check that these components function properly.

Consequently, the circuit arrangement for bridging the low-pass filter enables fast testing of the integrated semiconductor module using the terminal IN of the integrated module that is present anyway for the data bus. The hardware outlay for the circuit arrangement, with the demultiplexer DEMUX1 and the multiplexer MUX2, is small and can easily be realized. Moreover, the TAP controller that is present anyway for testing purposes can be used for driving the demultiplexer DEMUX1 and the multiplexer MUX2.

I claim:

1. An integrated semiconductor module for connection to a data bus, comprising:
    at least one terminal for connection to the data bus;
    a low-pass filter connected downstream of said terminal; and
    a circuit configuration for bypassing said low-pass filter for test purposes;
    said circuit configuration for bypassing said low-pass filter including:
        a demultiplexer having an input connected to the at least one input, said demultiplexer having a first output connected to said low-pass filter, said demultiplexer having a second output; and
        a multiplexer having a first input connected to said low-pass filter, said multiplexer having a second input connected to said second output of said demultiplexer, and said multiplexer having an output.

2. The integrated semiconductor module according to claim 1, wherein said terminal is designed for connection to an IIC bus.

3. The integrated semiconductor module according to claim 1, comprising:
    an interface circuit connected to said output of said multiplexer;
    said interface circuit for performing a function selected from the group consisting of processing data that is received via the data bus and providing data to be transmitted via the data bus.

4. The integrated semiconductor module according to claim 1, comprising:
    a controller provided for test purposes;
    said controller connected to said demultiplexer for driving said demultiplexer; and
    said controller connected to said multiplexer for driving said multiplexer.

* * * * *